US006987412B2

(12) United States Patent
Sutherland et al.

(10) Patent No.: US 6,987,412 B2
(45) Date of Patent: *Jan. 17, 2006

(54) SENSE AMPLIFYING LATCH WITH LOW SWING FEEDBACK

(75) Inventors: Ivan E. Sutherland, Santa Monica, CA (US); Robert J. Bosnyak, Tacoma, WA (US); Robert J. Drost, Mountain View, CA (US)

(73) Assignee: Sun Microsystems, Inc, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/816,761

(22) Filed: Apr. 2, 2004

(65) Prior Publication Data

US 2004/0212415 A1 Oct. 28, 2004

Related U.S. Application Data

(60) Provisional application No. 60/460,105, filed on Apr. 2, 2003.

(51) Int. Cl.
*H03K 3/356* (2006.01)
*H03L 5/00* (2006.01)

(52) U.S. Cl. ........................ 327/333; 327/208; 327/218

(58) Field of Classification Search ................ 327/333, 327/200, 202, 203, 208–212, 218, 219
See application file for complete search history.

(56) References Cited

U.S. PATENT DOCUMENTS 5,629,838 A 5/1997 Knight et al. ............... 361/782
5,724,303 A * 3/1998 Gannage et al. ......... 365/238.5
5,812,002 A * 9/1998 Yoshida ...................... 327/210
5,831,462 A 11/1998 Witt et al. .................. 327/199
6,097,651 A * 8/2000 Chan et al. ................. 365/203
6,225,846 B1 * 5/2001 Wada et al. ................ 327/215

(Continued)

FOREIGN PATENT DOCUMENTS

EP 0567716 * 3/1993

(Continued)

OTHER PUBLICATIONS

Publication: "Enhanced Voltage-Regulated Static Keeper Techniques for Reduced Standby Power", International Business Machines Corporation, Research Disclosure, Kenneth Mason Publications, Hampshire, GB, vol. 426 No. 75, Oct. 1999, XP007124932, ISSN: 0374-4353, the whole document.

*Primary Examiner*—Tuan T. Lam
(74) *Attorney, Agent, or Firm*—Park, Vaughan & Fleming, LLP; Edward J. Grundler

(57) ABSTRACT

A system is presented for latching and amplifying a capacitively coupled inter-chip communication signal that operates by receiving an input signal on a capacitive receiver pad and feeding the input signal through an inverter to produce an output signal. The output signal is fed back through a weakened inverter to produce a feedback signal that is fed into an input of the inverter to form a latch for the input signal. The weakened inverter is biased to produce a feedback signal that swings between a high bias voltage, $V_H$, and a low bias voltage, $V_L$. $V_H$ is set slightly higher than the switching threshold of the inverter, and $V_L$ is set slightly lower than the switching threshold. This feedback signal causes the input signal to reside within a narrow voltage range near the switching threshold of the inverter, thereby making the inverter sensitive to small transitions in the input signal.

12 Claims, 4 Drawing Sheets

U.S. PATENT DOCUMENTS 6,472,931 B1 10/2002 Drost et al. ................ 327/560
6,728,113 B1 4/2004 Knight et al. ............... 361/760
6,788,122 B2 * 9/2004 Jones, Jr. .................... 327/202
6,916,719 B1 7/2005 Knight et al. ............... 438/381

FOREIGN PATENT DOCUMENTS

EP 11186881 7/1999
WO WO 01/56084 A1 8/2001

* cited by examiner

SENSE AMPLIFYING LATCH WITH LOW SWING FEEDBACK

RELATED APPLICATION

This application hereby claims priority under 35 U.S.C. 119 to U.S. Provisional Patent Application No. 60/460,105, filed on 2 Apr. 2003, entitled "Sense Amplifying Latch with Low Swing Feedback," by inventors Ivan E. Sutherland, Robert J Bosnyak, and Robert J. Drost.

The subject matter of this application is related to the subject matter in a co-pending non-provisional application by Robert J. Proebsting and Robert J. Bosnyak entitled, "Method and Apparatus for Amplifying Capacitively Coupled Inter-Chip Communication Signals," having Ser. No. 10/772,106, and filing date 2 Feb. 2004.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to the process of transferring data between integrated circuits. More specifically, the present invention relates to a sense amplifying latch with low swing feedback for amplifying capacitively coupled inter-chip communication signals.

2. Related Art

Advances in semiconductor technology presently make it possible to integrate large-scale systems, including hundreds of millions of transistors, into a single semiconductor chip. Integrating such large-scale systems onto a single semiconductor chip increases the speed at which such systems can operate because signals between system components do not have to cross chip boundaries and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem creates a bottleneck that continues to grow as semiconductor integration densities continue to increase.

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit signals directly from the first chip to the second chip without having to route the signal through intervening signal lines within a printed circuit board.

However, it is not a simple matter to transmit and receive signals across capacitive pads. One problem is that signals become attenuated by the relatively large capacitance caused by layers of metal and silicon dioxide underneath the capacitive pads. In order to deal with this attenuation problem, the received signal needs to be amplified using a sensitive amplifier.

Unfortunately, increasing the sensitivity of the circuitry to small signals also increases the sensitivity of the circuit to noise. The reverse is also true. Reducing the sensitivity of the circuit to noise also reduces the sensitivity of the circuitry to small signals.

Hence, what is needed is a method and an apparatus for transmitting capacitively coupled signals between semiconductor chips without the problems described above.

SUMMARY

One embodiment of the present invention provides a system for latching and amplifying a capacitively coupled inter-chip communication signal. The system operates by first receiving an input signal on a capacitive receiver pad from a capacitive transmitter pad and feeding the input signal through an inverter to produce an output signal. The output signal is then fed back through a weakened inverter to produce a feedback signal that is fed back into an input of the inverter so as to form a latch for the input signal between the inverter and the weakened inverter. The weakened inverter is biased to produce a feedback signal that swings between a high bias voltage, $V_H$, and a low bias voltage, $V_L$. $V_H$ is set slightly higher than a switching threshold of the inverter, and $V_L$ is set slightly lower than the switching threshold of the inverter. Hence, this feedback signal causes the input signal to reside within a narrow voltage range near the switching threshold of the inverter, thereby making the inverter sensitive to small transitions in the input signal received on the capacitive receiver pad.

In a variation of this embodiment, the system amplifies the output of the inverter through an amplification stage to produce an amplified output signal.

In a further variation, the system establishes the high bias voltage, $V_H$, with a high bias voltage generator and establishes the low bias voltage, $V_L$, with a low bias voltage generator.

In a further variation, the high bias voltage generator includes a mechanism for adjusting the high bias voltage, $V_H$, and the low bias voltage generator includes a mechanism for adjusting the low bias voltage, $V_L$.

In a further variation, the system adjusts the high bias voltage generator and the low bias voltage generator to provide a specified sensitivity to transitions of the input signal.

In a further variation, the system adjusts the high bias voltage generator and the low bias voltage generator to provide a specified noise immunity to noise associated with the input signal.

In a further variation, the system adjusts the RC time constant for the feedback signal so that the time constant for the feedback signal is significantly larger than the time constant for the transmitted signal from the capacitive transmitter pad, thereby ensuring that the feedback signal does not mask transitions of the transmitted signal.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Inter-Chip Communication through Capacitive Coupling

Figure 1:
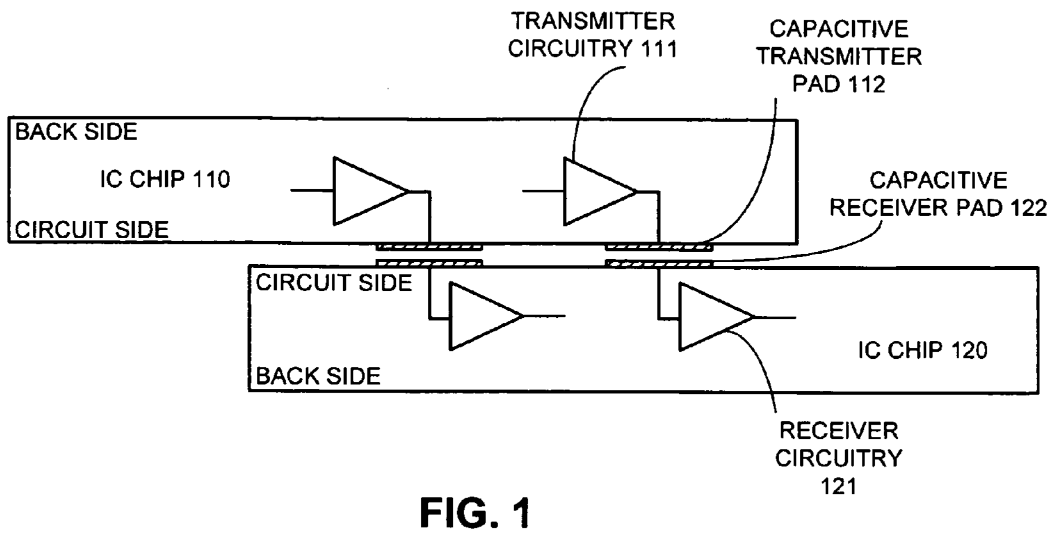
FIG. 1 illustrates inter-chip communication through capacitive pads in accordance with an embodiment of the present invention.

FIG. 1 illustrates inter-chip communication through capacitive pads in accordance with an embodiment of the present invention. The transmitting integrated circuit (IC) chip 110 contains transmitter circuitry 111, which feeds a signal into a capacitive transmitter pad 112. The signal is capacitively transmitted to capacitive receiver pad 122, and then passes into receiver circuitry 121 located in receiving IC chip 120. Note that when the transmitter and receiver pads are properly aligned, there is no direct physical contact between the transmitter and receiver pads, and signals are transmitted through capacitive coupling.

Sense Amplifying Latch with Low Swing Feedback

Figure 2:
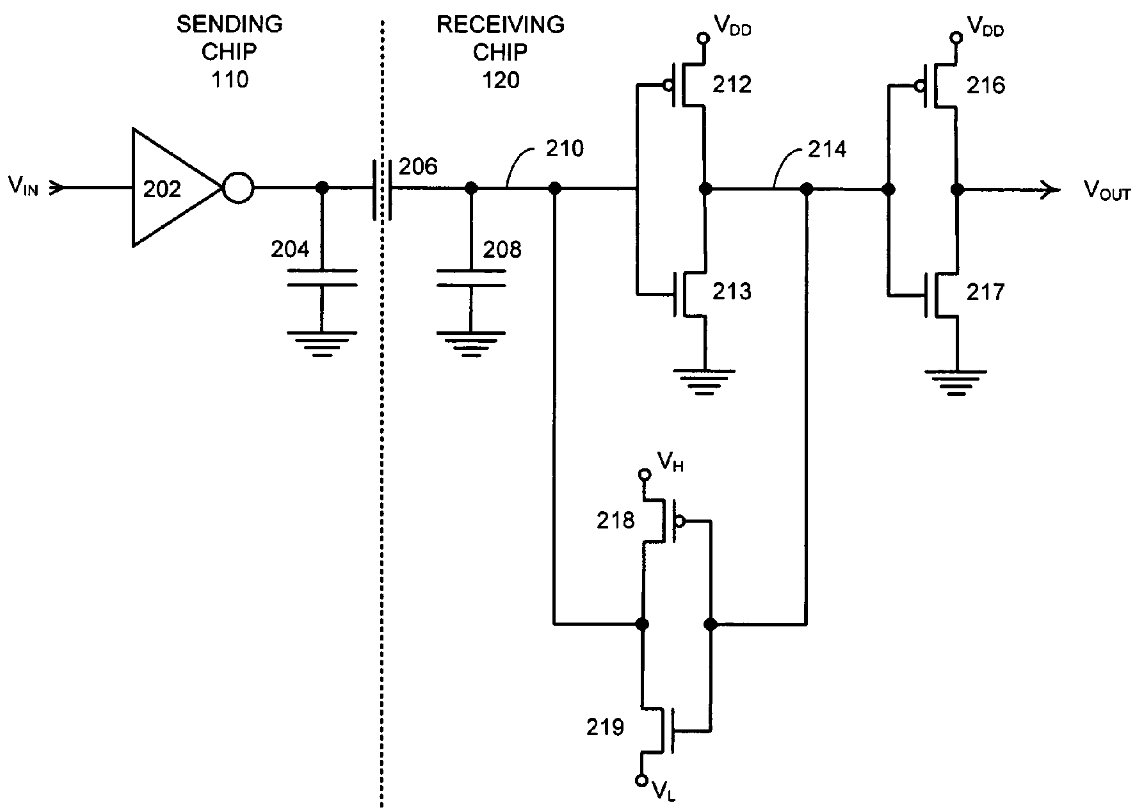
FIG. 2 illustrates a sense amplifying latch with low swing feedback in accordance with an embodiment of the present invention.

FIG. 2 illustrates a sense amplifying latch with low swing feedback in accordance with an embodiment of the present invention. The left portion of FIG. 2 includes transmitting circuitry of sending chip 110, while the right portion of FIG. 2 includes receiving circuitry of receiving chip 120. Sending chip 110 includes a drive inverter 202, parasitic capacitance 204, and a transmitting pad that is part of capacitor 206, which is used to transmit signals between sending chip 110 and receiving chip 120. Parasitic capacitance 204 represents the stray capacitance between the sending plate of capacitor 206 and underlying portions of sending chip 110.

Receiving chip 120 includes the receiving pad that is part of capacitor 206 and parasitic capacitance 208. Parasitic capacitance 208 represents the stray capacitance between the receiving plate of capacitor 206 and underlying portions of receiving chip 120. The sense amplifier illustrated in FIG. 2 includes the inverter comprising transistors 212–213 with input node 210 and output node 214. This inverter receives input from capacitor 206 and produces an output which drives the output inverter comprising transistors 216–217. This output inverter drives the output voltage $V_{OUT}$.

Feedback around the sense amplifier is provided by two small transistors 218–219. Transistors 218–219 form a "weakened" inverter. This weakened inverter and the inverter formed from transistors 212–213 are connected "back-to-back" to form a flip-flop.

Note, however, that the sources of transistors 218–219 are coupled to voltage sources $V_H$ and $V_L$, respectively. $V_L$ is slightly lower in voltage than the switching threshold of the sense amplifier, and $V_H$ is slightly higher than the switching threshold voltage. When node 214 is HI, transistor 219 conducts, clamping node 210 to $V_L$ and holding node 214 HI. When node 214 is LO, transistor 218 conducts, clamping node 210 to $V_H$ and holding node 214 LO. Although transistors 212–213 and 218–219 form a flip-flop, the voltage swing permitted at node 210 is small, limited by $V_L$ and $V_H$, but the voltage swing permitted at node 2141 is not limited. Because the voltage swing on node 214 is large, the crossover point of the output driver formed from transistors 216–217 does not need to match that of the sense amplifier. The voltage sources $V_L$ and $V_H$ will be discussed in more detail below in conjunction with FIG. 3.

The flip-flop formed by transistors 212–213 and 218–219 is stable in one of two states. In either state, the voltage at node 210 is only slightly different than the switching threshold of the sense amplifier. Moreover, transistors 218–219 are small in comparison to transistors 212–213 and can easily be overpowered by signals coming from capacitor 206.

Spice models indicate that much of the charge delivered by capacitor 206 onto node 210 goes into the Miller capacitance of the sense amplifier. When drive inverter 202 switches, node 210 changes voltage approximately $V_{dd}/2$ and then is dragged back by the Miller capacitance through the sense amplifier as node 214 changes in the opposite direction. Ultimately, the voltage on node 210 changes by the difference between $V_H$ and $V_L$.

Making transistors 212–213 wider increases the Miller capacitance and thus reduces the voltage swing at node 214. However, wider transistors provide more output current. Making transistors 212–213 narrower permits more swing on node 214 and on node 210 as well. However, if node 210 swings more than the difference between $V_H$ and $V_L$, charge from capacitor 206 is lost to transistors 218–219.

The ideal design matches the capacitance of capacitor 206, the width of transistors 212–213, and the voltage difference $V_H–V_L$. In such an ideal design, the signal at node 210 changes gracefully from $V_H$ to $V_L$ and back without significant overshoot. Any of the factors may change. Larger capacitance proved more charge which may be used either with a larger spread $V_H–V_L$ or with wider transistors 212–213.

This design has some noise rejection capabilities. Small changes in the voltage output of drive inverter 202 become partial signals at node 210. Providing that these changes are smaller than one-half of the ideal signal, they will be unable to switch the receiving flop-flop. A sense amplifier that is too sensitive may pick up undesirable changes.

The major sensitivity of the system to noise is from two sources. First, stray coupling of power supply noise on receiving chip 120 into node 210 might be confused with signal. Capacitor 206, therefore, must be shielded from unrelated signals, even at the expense of increasing parasitic capacitance 208 by adding shielding wires around capacitor 206. Parasitic capacitance 208, as shown, couples node 210 to ground. Power supply noise on receiving chip 120 will change the switching threshold of the sense amplifier, effectively producing noise at the sense amplifier's input. It is important to construct parasitic capacitance 208 from two parts, a positive part coupling to $V_{dd}$, and a negative part coupling to ground. Moreover, the proportion of coupling, i.e. the ratio of the positive part to the negative part should be chosen to minimize the impact of $V_{dd}$ noise at the sense amplifier's output. Because the switching threshold of the sense amplifier is somewhat below $V_{dd}/2$, the positive part will probably exceed the negative part in value.

The second source of noise comes from power supply changes between the chips. Changes in the relative voltage of the power system on sending chip 110 and receiving chip 120 is indistinguishable form the real signal. The system counts on the large stray capacitance of the area of the chips to minimize such changes, but a sense amplifier that is too sensitive will pick up small changes in the relative power voltages.

The system must strike a balance between sensitivity to the desired signal and sensitivity to noise. The ideal amplifier has a noise rejection capability of 50%. For the ideal sense amplifier, a change of $V_{dd}$ volts at the output of drive inverter 202 results in a change of $(V_H-V_L)$ volts at node 210. Changes at node 210 of half of that value will fail to switch the flip-flop. If the sense amplifier is more sensitive, smaller changes will switch the output erroneously. If the sense amplifier is lass sensitive, desired signals may fail to switch it.

The sensitivity of the sense amplifier can be adjusted by changing the width of transistors 212–213, or by changing the voltage spread of $(V_H-V_L)$. $V_H$ and $V_L$ can be made adjustable to allow different sensitivities. This is described more fully in conjunction with FIG. 3 below.

Programmable Voltage Source

Figure 3:
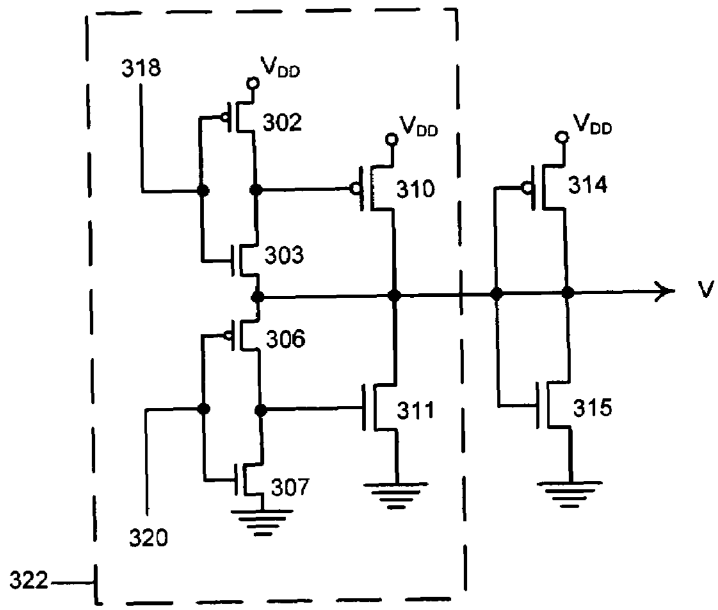
FIG. 3 illustrates a programmable voltage source in accordance with an embodiment of the present invention.

FIG. 3 illustrates a programmable voltage source in accordance with an embodiment of the present invention. This programmable voltage source provides voltage V ($V_L$ or $V_H$) from the junction between transistors 314–315. Note that the circuitry for generating $V_H$ is similar to the circuitry for generating $V_L$. The transistors for generating $V_H$ and $V_L$ are different and these differences will be described. The components in box 322 are used to electrically adjust V and are optional. These components will be discussed below.

$V_H$ and $V_L$ originate from fixed inverters represented by transistors 314–315. Because the P/N width ratios of these inverters differ, so do the voltages $V_H$ and $V_L$. In particular, note that the P/N width ratio of the sense amplifier is 1/1, the P/N width ratio of the $V_H$ inverter is 2/1, and the P/N width ratio of the $V_L$ inverter is 1/2. Because of the differences in P/N width ratio, $V_H>V_S>V_L$, where $V_S$ is the switching threshold of the sense amplifier. For these ratios in 0.35 micron technology operating at 3.3 volts main supply, $V_H$ and $V_L$ differ by about 0.6 volts. $V_H=V_S+0.3$ volts and $V_L=V_S-0.3$ volts. Other ratios can be chosen to adjust the value of $V_H$ and $V_L$ as desired.

The circuitry within box 322 can be used to electrically adjust the value of V at the junction of transistors 314–315. Transistor 310 can be turned on or turned off depending on the state of the inverter formed by transistors 302–303. Likewise, transistor 311 can be turned on or turned off depending on the state of the inverter formed by transistors 306–307. Turning transistor 310 on effectively brings V closer to $V_{dd}$, while turning transistor 315 on effectively brings V closer to ground. The inverter comprising transistors 302–303 is controlled by signal 318, while the inverter comprising transistors 306–307 is controlled by signal 320. Note that the circuitry within box 322 can be replicated multiple times to further control the voltage V.

Design Considerations

There are multiple choices that must be made in designing these circuits. The first choice is the width of drive inverter 202. Drive inverter 202 must be capable of driving capacitors 204 and 206. For an assumed capacitor plate 30 microns square, capacitor will be about 15 fF. The capacitance of parasitic capacitance 204 is about the same. The capacitance of parasitic capacitance 208, although about the same capacitance, is of much less importance because to voltage swing on node 210 is small. Thus, the total load on drive inverter 202 is about twice the coupling capacitance, or 30 fF. This is similar to the capacitance of 150 microns of wire, or 15 microns of gate material. With a step-up of 3, drive inverter 202 might easily be as small as P=4, N=2, or about the size of a single standard latch. Three latches are used in parallel for extra fast operation.

The second choice is the P/N ratio of the sense amplifier. The sense amplifier shown in FIG. 2 has a P/N ration of 1/1, but other ratios can be used. This choice establishes the switching threshold, $V_S$, of the sense amplifier.

The third choice is the P/N ratio of the inverters that produce $V_H$ and $V_L$. These should be set to establish the voltage differences $(V_H-V_S)$ and $(V_S-V_L)$. These voltage differences establish the sensitivity of the system. Larger differences will give larger noise immunity, but less sensitivity. $V_H$ and $V_L$ can be made adjustable as described above.

The fourth choice is the width of the transistors in the sense amplifier. The combination of a transistor width and the value of $(V_H-V_L)$ determines the minimum value of capacitor 206 for which the sense amplifier will switch properly. If the sense amplifier has transistors that are too wide, it will fail to switch in response to drive inverter 202. If the sense amplifier has transistors that are too narrow, it will be extra sensitive to noise. Making the sense amplifier transistors wider, of course, provides extra drive at its output node 214.

There is also a matching consideration. The difference between $V_H$ and $V_L$ is small, and $V_S$ must lie accurately between them. Thus, the properties of transistors 212–213 used in the sense amplifier and transistors 302–303 and 306–307 in the supply circuits for $V_H$ and $V_L$ must track well. These circuits are fabricated from multiple copies of identical transistors of a standard size. For example, transistors 212–213 may be made from three copies of an inverter with a one micron wide P transistor and a one micron wide N transistor. Source $V_H$, for example, can be an identical circuit with three additional one micron wide P transistors, making a total of 6 P and 3 N transistors. Using identical transistors in identical orientation and close proximity should make their properties track well enough for this purpose. Source $V_L$ can be fabricated similarly.

Logical Effort Considerations

An estimate can be made of the logical effort of this communication path. Simulation suggests that for parasitic capacitance 204= capacitor 206=parasitic capacitance 208=15 fF, drive inverter 202 needs a total of about 18 microns of transistor width. Transistors 212–213 are best set to a total of about 9 microns. Thus, from $V_{IN}$, which must drive 18 microns of gate, to node 214, which can drive (9*3)=27 microns of gate, a gain of 1.5 is made given a step-up of 3. A gain of 9 should have been made in two stages of amplification. Therefore, a loss factor of (9/1.5)=6 has been made in the process and can be assigned as the logical effort of the capacitive coupling.

This logical effort originate from the branching effort between parasitic capacitance 204 and capacitor 206, which costs a factor of two and, although the voltage swing at node 210 is small, parasitic capacitance 208 drains some current form node 210, giving another branching effort somewhat less than two. This leaves approximately another factor of two to take into account.

This final factor of about two arises from the small voltage swing permitted at node 210. The small swing there reduces the ability of the sense amplifier to deliver output current. Some of this factor also comes from the keeper transistors 218–219 which take some, albeit small, current. Keeper transistors 218–219 also select against low frequency noise at the input. For slow changes in input voltage, keeper transistors 218–219 are able to discharge capacitor 206 before the voltage on node 210 changes very much. It takes a fast switching signal form drive inverter 202 to drive node 210 far enough to switch the sense amplifier. Transistors 218–219 thus form a "high-pass" filter.

Looking at the amplifier form a logical effort point of view may establish the minimum size of capacitor plate possible for capacitor 206. A smaller capacitor implies narrower transistors 212–213 or less noise margin by reducing $(V_H-V_L)$. Narrower transistors 212–213 will provide less drive. Is is possible to work backwards from a requirement for output current to decide how big capacitor 206 must be made for satisfactory operation. A smaller capacitor yields greater geometric density of the capacitor pads.

Selected Waveforms

Figure 4:
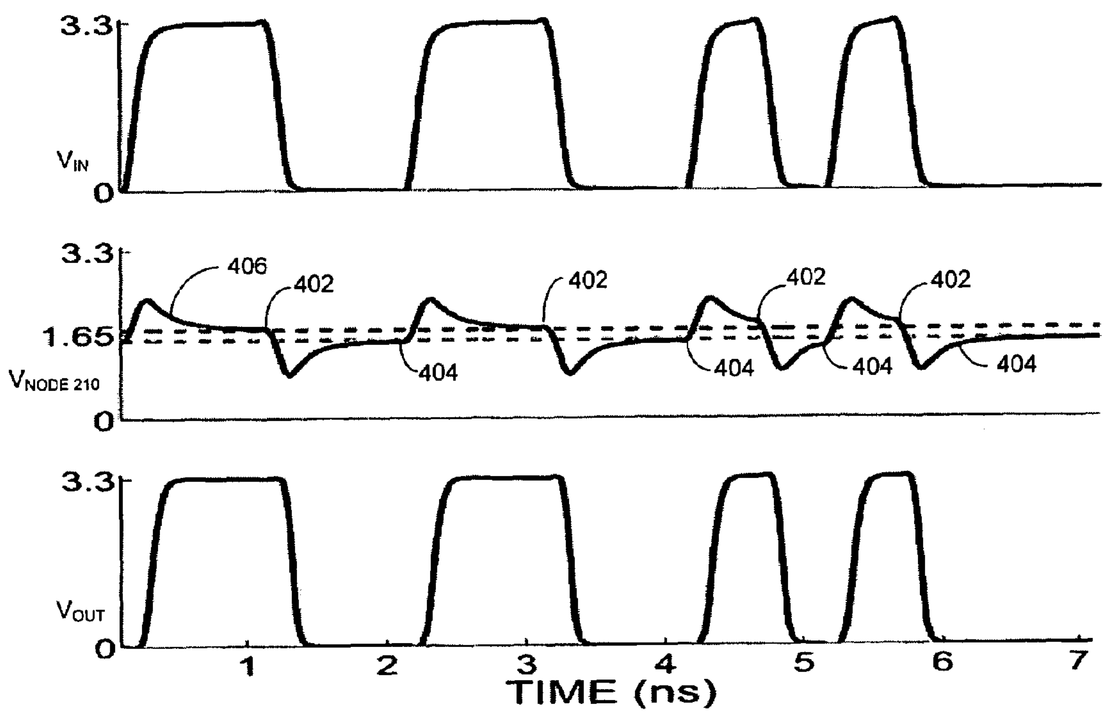
FIG. 4 illustrates selected waveforms in accordance with an embodiment of the present invention.

FIG. 4 illustrates selected waveforms in accordance with an embodiment of the present invention. The upper waveform corresponds to a typical input to drive inverter 202, while the lower waveform corresponds to the output of inverter 216–217. This inverter provides a near rail-to-rail output generated from the voltage at node 214.

The center waveform typifies the voltage waveform at node 210. Note that $V_S$ is approximately 1.65 volts. The upper dashed line in FIG. 4 represents $(V_H-V_S)$ while the lower dashed line represents $(V_S-V_L)$. Note that when $V_{IN}$ has a positive transition, the voltage at node 210 goes positive and settles back to $(V_H-V_S)$ at point 402. Likewise, note that when $V_{IN}$ has a negative transition, the voltage at node 210 goes negative and settles back to $(V_S-V_L)$ at point 404. The voltage band between the upper dashed line and the lower dashed line is representative of the noise immunity of the circuit as described above.

The slope 406 of the signal coupled through capacitor 206 is controlled by the time constant of the feedback from node 214 to node 210 relative to the time constant of the signal coupled through capacitor 206. The time constant of the feedback is a function of capacitor 206, the parasitic capacitance 208, and the resistance presented by the feedback inverter and the programmable voltage sources. Note that the time constant of the feedback is long in relation to the time constant of the signal and must be at least two times the time constant of the signal.

Sense Amplifier with a Controllable Feedback Pole

Figure 5:
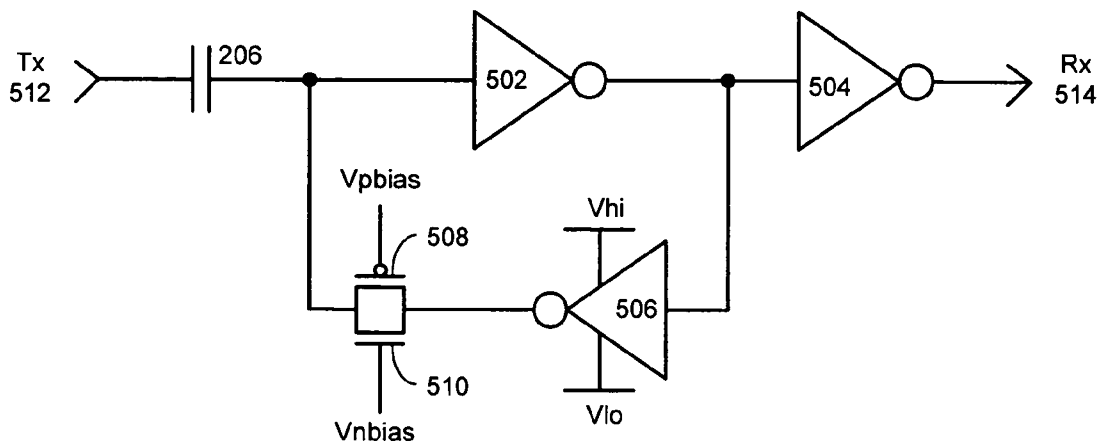
FIG. 5 illustrates a sense amplifier with a controllable feedback pole in accordance with an embodiment of the present invention.

FIG. 5 illustrates a sense amplifier with a controllable feedback pole in accordance with an embodiment of the present invention. The sense amplifier with the controllable feedback pole includes forward inverter 502, feedback inverter 506, and a variable resistance implemented using transistors 508 and 510. Inverter 504 couples the output to the remaining circuitry on the receiver side.

During operation, input signal Tx 512 is passed through capacitor 206 into inverter 502. The output of inverter 502 is passed through inverter 504 to become output signal Rx 514. The output of inverter 502 is also fed to the input of feedback inverter 506. The Vhi and Vlo supplied to inverter 506 are as described above. The output of feedback inverter 506 is passed through a variable resistance comprising transistors 508 and 510.

The variable resistance comprised of transistors 508 and 510 controls the feedback pole of the sense amplifier. This provides an important advantage. The receiving signal amplitude is kept constant. The pole attenuates the transition. If the input transition suffers excessive attenuation, then the signal will not be recognized by the receiver inverter. The pole RC time constant should be close to the transition time of the input signal because this pole rejects other noise sources. In particular, noise coupled from power supplies or the chip substrate are attenuated if the pole frequency is high relative to the noise source frequency. The resistance, and hence the RC time constant, is controlled using Vpbias and Vnbias to control the conductance of transistors 508 and 510.

Implementation of a Sense Amplifier with a Controllable Feedback Pole

Figure 6:
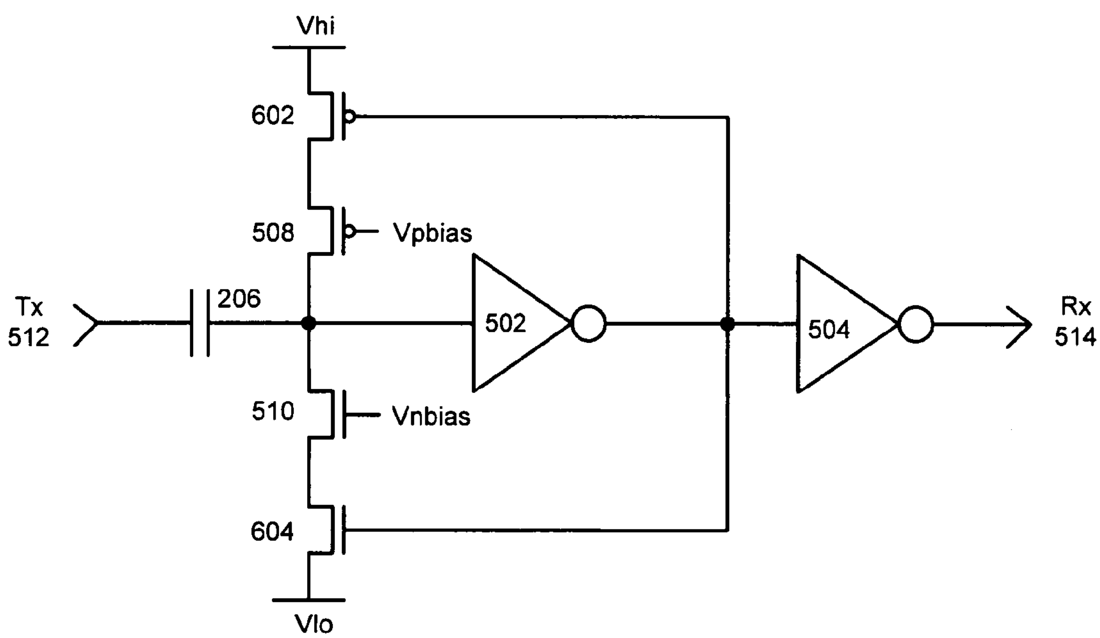
FIG. 6 illustrates an implementation of the sense amplifier with a controllable feedback pole of FIG. 5 in accordance with an embodiment of the present invention.

FIG. 6 illustrates an implementation of the sense amplifier with a controllable feedback pole of FIG. 5 in accordance with an embodiment of the present invention. Transistors 508 and 510 are placed in series with feedback transistors 602 and 604. Transistors 602 and 604 implement inverter 506 of FIG. 5.

Linear Model of a Sense Amplifier with a Variable Feedback Pole

Figure 7:
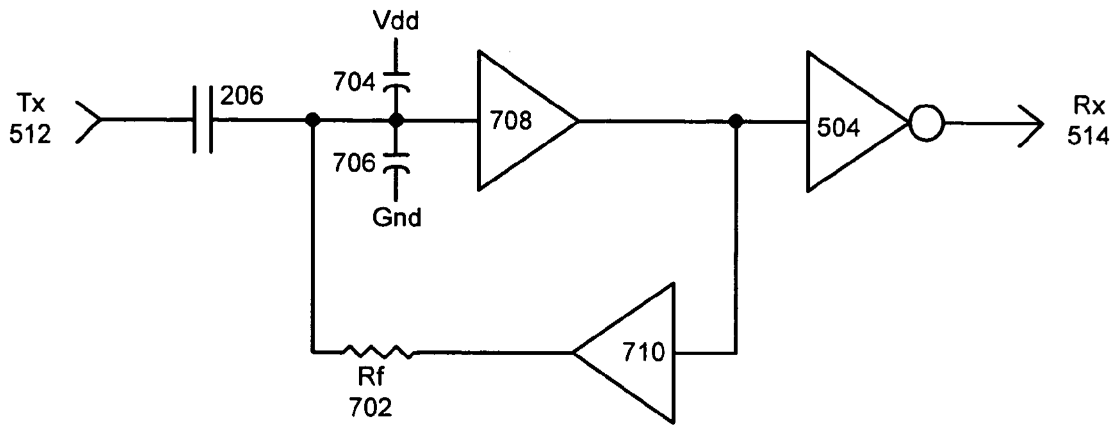
FIG. 7 illustrates a linear model of a sense amplifier with a variable feedback pole in accordance with an embodiment of the present invention.

FIG. 7 illustrates a linear model of a sense amplifier with a variable feedback pole in accordance with an embodiment of the present invention. Inverters 502 and 506 operate as negative gain amplifiers 708 and 710. Amplifier 710 drives the RC circuit comprised of Rf 702 and stray capacitances 704 and 706. Rf 702 is the variable resistance provided by transistors 508 and 510. by controlling the resistance of Rf 702, the time constant of Rf 702 and capacitors 704 and 706 can be controlled, thereby adjusting the pole of the feedback circuit.

Bias Generation Circuit

Figure 8:
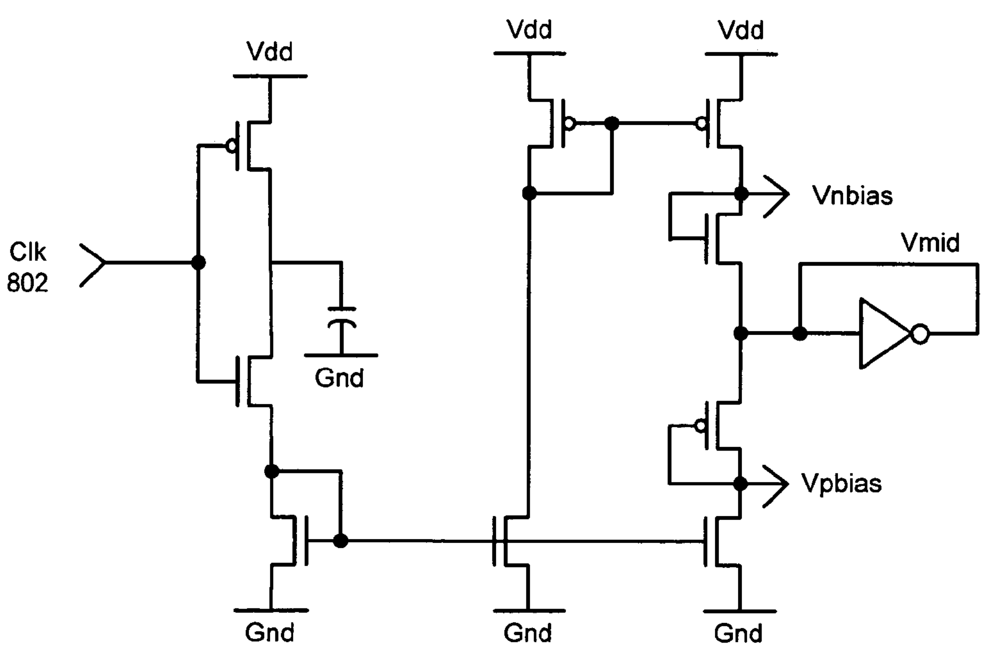
FIG. 8 illustrates a bias generation circuit in accordance with an embodiment of the present invention.

FIG. 8 illustrates a bias generation circuit in accordance with an embodiment of the present invention. The circuit illustrated in FIG. 8 provides the bias voltages Vpbias and Vnbias. The value of Vpbias and Vnbias is controlled by the frequency of Clk 802.

In a version of the sense amplifier without control of the feedback pole, the Vpbias voltage is Gnd, and the Vnbias voltage is Vdd. In this version, the transistors are made with small width and large length. In a 0.35 micron CMOS technology for instance, the values may be a width of 0.6 micron and a length of 1.2 microns.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for latching and amplifying a capacitively coupled inter-chip communication signal, comprising:

receiving an input signal on a capacitive receiver pad from a capacitive transmitter pad;

feeding the input signal through an inverter to produce an output signal;

feeding the output signal through a weakened inverter to produce a feedback signal;

adjusting an RC time constant for the feedback signal so that the time constant for the feedback signal is significantly larger than the time constant for the transmitted signal from the capacitive transmitter pad, thereby ensuring that the feedback signal does not mask transitions of the transmitted signal;

feeding the feedback signal back into an input of the inverter so as to form a latch for the input signal between the inverter and the weakened inverter; and establishing a high bias voltage, $V_H$, with a high bias voltage generator and establishing a low bias voltage, $V_L$, with a low bias voltage generator;

wherein the high bias voltage generator includes a mechanism for adjusting the high bias voltage, $V_H$;

wherein the low bias voltage generator includes a mechanism for adjusting the low bias voltage, $V_L$;

wherein the weakened inverter is biased to produce the feedback signal that swings between the high bias voltage, $V_H$, and the low bias voltage, $V_L$; and wherein $V_H$ is slightly higher than a switching threshold of the inverter, and $V_L$ is slightly lower than the switching threshold of the inverter, whereby the feedback signal causes the input signal to reside within a narrow voltage range near the switching threshold of the inverter, thereby making the inverter sensitive to small transitions in the input signal received on the capacitive receiver pad.

2. The method of claim 1, further comprising amplifying an output of the inverter through an amplification stage to produce an amplified output signal.

3. The method of claim 2, further comprising adjusting the high bias voltage generator and the low bias voltage generator to provide a specified sensitivity to transitions of the input signal.

4. The method of claim 2, further comprising adjusting the high bias voltage generator and the low bias voltage generator to provide a specified noise immunity to noise associated with the input signal.

5. An apparatus for latching and amplifying a capacitively coupled inter-chip communication signal, comprising:

a receiving mechanism configured to receive an input signal on a capacitive receiver pad from a capacitive transmitter pad;

a latching mechanism configured to feed the input signal through an inverter to produce an output signal;

a biasing mechanism configured to establishing a high bias voltage, $V_H$, with a high bias voltage generator and establishing a low bias voltage, $V_L$, with a low bias voltage generator; and an adjusting mechanism configured to adjust an RC time constant for the feedback signal so that the time constant for the feedback signal is significantly larger than the time constant for the transmitted signal from the capacitive transmitter pad, thereby ensuring that the feedback signal does not mask transitions of the transmitted signal;

wherein the high bias voltage generator includes a mechanism for adjusting the high bias voltage, $V_H$;

wherein the low bias voltage generator includes a mechanism for the low bias voltage, $V_L$;

wherein the latching mechanism is further configured to feed the output signal through a weakened inverter to produce a feedback signal;

wherein the latching mechanism is further configured to feed the feedback signal back into an input of the inverter so as to form a latch for the input signal between the inverter and the weakened inverter;

wherein the weakened inverter is biased to produce the feedback signal that swings between the high bias voltage, $V_H$, and the low bias voltage, $V_L$; and wherein $V_H$ is slightly higher than a switching threshold of the inverter, and $V_L$ is slightly lower than the switching threshold of the inverter, whereby the feedback signal causes the input signal to reside within a narrow voltage range near the switching threshold of the inverter, thereby making the inverter sensitive to small transitions in the input signal received on the capacitive receiver pad.

6. The apparatus of claim 5, further comprising an amplifying mechanism configured to amplify an output of the inverter through an amplification stage to produce an amplified output signal.

7. The apparatus of claim 6, further comprising an adjusting mechanism configured to adjust the high bias voltage generator and the low bias voltage generator to provide a specified sensitivity to transitions of the input signal.

8. The apparatus of claim 6, further comprising an adjusting mechanism configured to adjust the high bias voltage generator and the low bias voltage generator to provide a specified noise immunity to noise associated with the input signal.

9. A means for latching and amplifying a capacitively coupled inter-chip communication signal, comprising:

a receiving means for receiving an input signal on a capacitive receiver pad from a capacitive transmitter pad;

a latching means configured to feed the input signal through an inverter to produce an output signal; and a biasing means for establishing a high bias voltage, $V_H$, with a high bias voltage generator and for establishing a low bias voltage, $V_L$, with a low bias voltage generator;

an adjusting means for adjusting an RC time constant for the feedback signal so that the time constant for the feedback signal is significantly larger than the time constant for the transmitted signal from the capacitive transmitter pad, thereby ensuring that the feedback signal does not mask transitions of the transmitted signal:

wherein the high bias voltage generator includes a mechanism for adjusting the high bias voltage, $V_H$; and wherein the low bias voltage generator includes a mechanism for the low bias voltage, $V_L$;

wherein the latching means is further configured to feed the output signal through a weakened inverter to produce a feedback signal;

wherein the latching means is further configured to feed the feedback signal back into an input of the inverter so as to form a latch for the input signal between the inverter and the weakened inverter;

wherein the weakened inverter is biased to produce the feedback signal that swings between the high bias voltage, $V_H$, and the low bias voltage, $V_L$; and wherein $V_H$ is slightly higher than a switching threshold of the inverter, and $V_L$ is slightly lower than the switching threshold of the inverter, whereby the feedback signal causes the input signal to reside within a narrow voltage range near the switching threshold of the inverter, thereby making the inverter sensitive to small transitions in the input signal received on the capacitive receiver pad.

10. The means of claim 9, further comprising an amplifying means for amplifying an output of the inverter through an amplification stage to produce an amplified output signal.

11. The means of claim 10, further comprising an adjusting means for adjusting the high bias voltage generator and the low bias voltage generator to provide a specified sensitivity to transitions of the input signal.

12. The means of claim 10, further comprising an adjusting means for adjusting the high bias voltage generator and the low bias voltage generator to provide a specified noise immunity to noise associated with the input signal.

* * * * *